(12) United States Patent
Bonicatto et al.

(10) Patent No.: US 11,119,133 B2
(45) Date of Patent: Sep. 14, 2021

(54) MULTIPLE ANTENNAS ON METER ENCLOSURE

(71) Applicant: Landis+Gyr Innovations, Inc., Alpharetta, GA (US)

(72) Inventors: Damian Bonicatto, Pequot Lakes, MN (US); Anthony J. Besett, Sebeka, MN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 102 days.

(21) Appl. No.: 16/280,613

(22) Filed: Feb. 20, 2019

(65) Prior Publication Data

US 2020/0264218 A1    Aug. 20, 2020

(51) Int. Cl.
*G01R 22/06* (2006.01)
*H01Q 1/22* (2006.01)
*H01Q 9/04* (2006.01)
*H01Q 21/28* (2006.01)

(52) U.S. Cl.
CPC .............. *G01R 22/063* (2013.01); *H01Q 1/22* (2013.01); *H01Q 9/0407* (2013.01); *H01Q 21/28* (2013.01)

(58) Field of Classification Search
None
See application file for complete search history.

(56) References Cited

U.S. PATENT DOCUMENTS

| 7,724,204 | B2 * | 5/2010 | Annamaa | H01Q 1/50 343/906 |
| 8,593,828 | B2 * | 11/2013 | Blackwell, Jr. | G02B 6/428 361/810 |
| 8,606,178 | B2 * | 12/2013 | Petrucci | H04B 1/0064 455/41.1 |
| 2003/0169205 | A1 * | 9/2003 | Gioia | H01Q 1/088 343/702 |

(Continued)

FOREIGN PATENT DOCUMENTS

WO    2019001762    1/2019

OTHER PUBLICATIONS

Hu et al., "Building Smartphone Antennas That Play Nice Together", IEEE Spectrum, Available online at : https://spectrum.ieee.org/telecom/wireless/building-smartphone-antennas-that-play-nice-together, Oct. 23, 2018, 6 pages.

(Continued)

*Primary Examiner* — Jermele M Hollington
(74) *Attorney, Agent, or Firm* — Kilpatrick Townsend & Stockton LLP

(57) ABSTRACT

An electricity meter includes: a housing; a plurality of antennas, each of the plurality of antennas comprising a contacting portion, the contacting portion formed on an interior surface of the housing; a printed circuit board (PCB) disposed within the housing, the PCB including a plurality of communications circuits, each of the plurality of communications circuits operable to communicate using different communications technologies; and a plurality of contacts (Continued)

disposed on the PCB, each of the plurality of contacts configured to provide a solderless electrical connection between contacting portions of one or more of the plurality of antennas and one of the plurality of communications circuits when the PCB is installed in the housing.

20 Claims, 9 Drawing Sheets

(56) References Cited

U.S. PATENT DOCUMENTS

| | | | |
|---|---|---|---|
| 2008/0024115 A1* | 1/2008 | Makinson | H01R 29/00 |
| | | | 324/142 |
| 2008/0129536 A1* | 6/2008 | Randall | H01Q 1/2233 |
| | | | 340/870.02 |
| 2008/0136667 A1* | 6/2008 | Vaswani | G01D 4/004 |
| | | | 340/870.02 |
| 2010/0253538 A1 | 10/2010 | Smith | |
| 2014/0302888 A1* | 10/2014 | Syal | H04M 1/0256 |
| | | | 455/552.1 |
| 2017/0003331 A1 | 1/2017 | Sato | |
| 2018/0375192 A1* | 12/2018 | Yen | H01Q 1/243 |
| 2019/0041920 A1 | 2/2019 | Spanier et al. | |
| 2020/0212985 A1* | 7/2020 | Lin | H04B 7/0671 |

OTHER PUBLICATIONS

International Patent Application No. PCT/US2020/018020, International Search Report and Written Opinion dated Jun. 29, 2020, 12 pages.

* cited by examiner

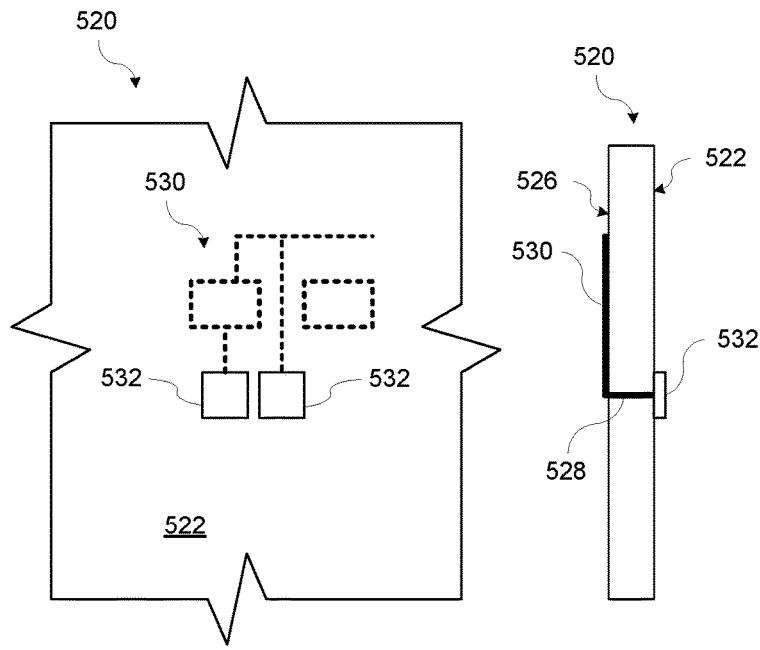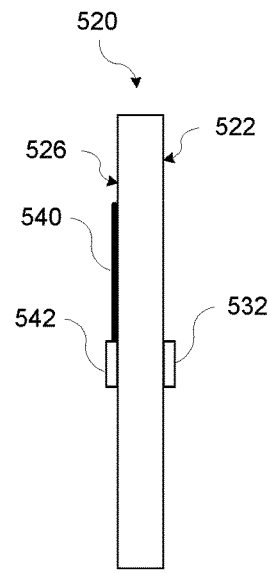
FIG. 5A  FIG. 5B
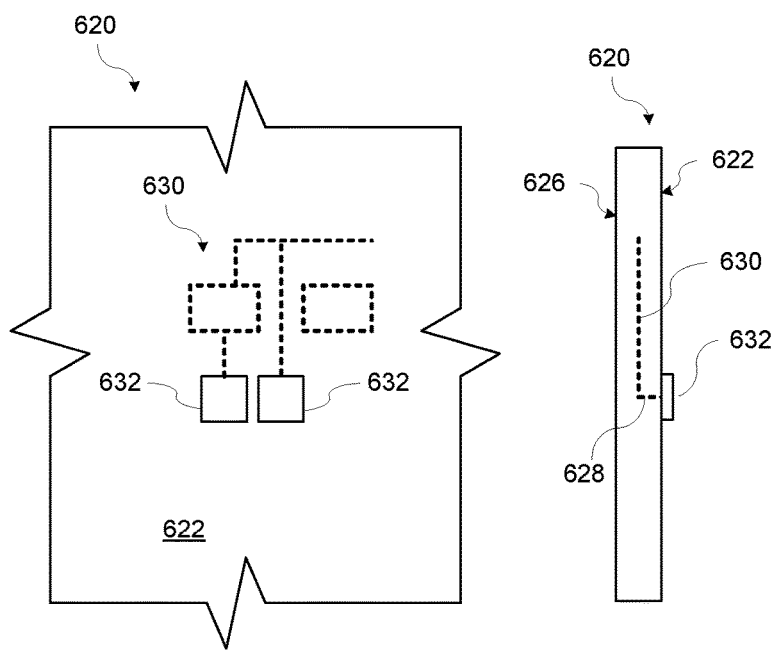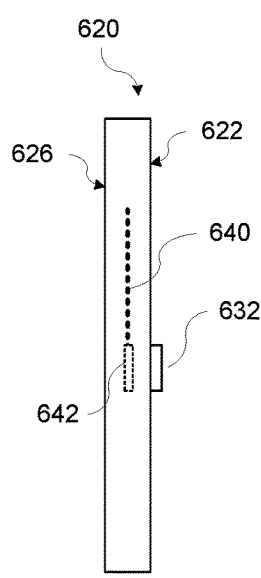
FIG. 6A  FIG. 6B

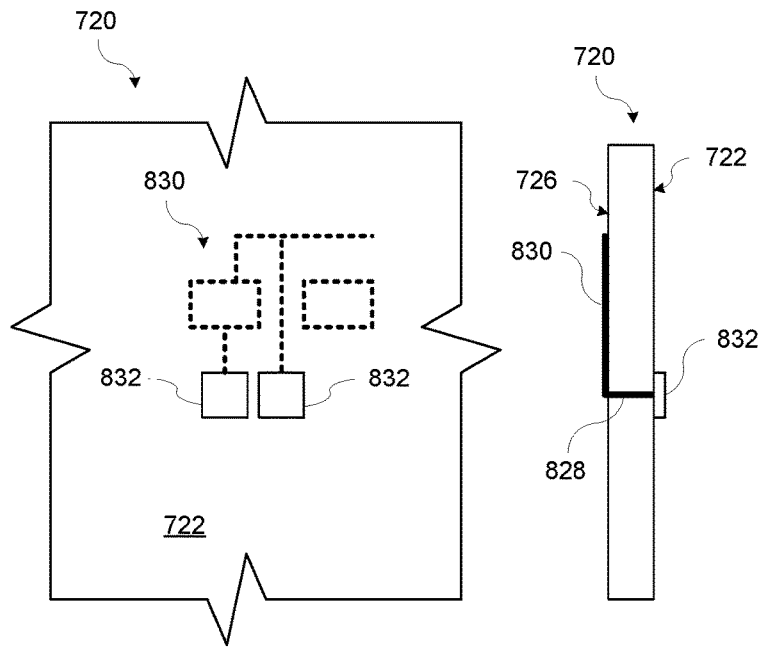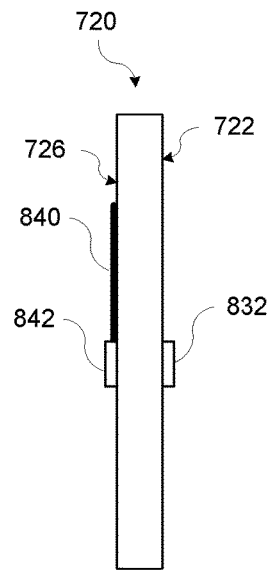
FIG. 8A  FIG. 8B
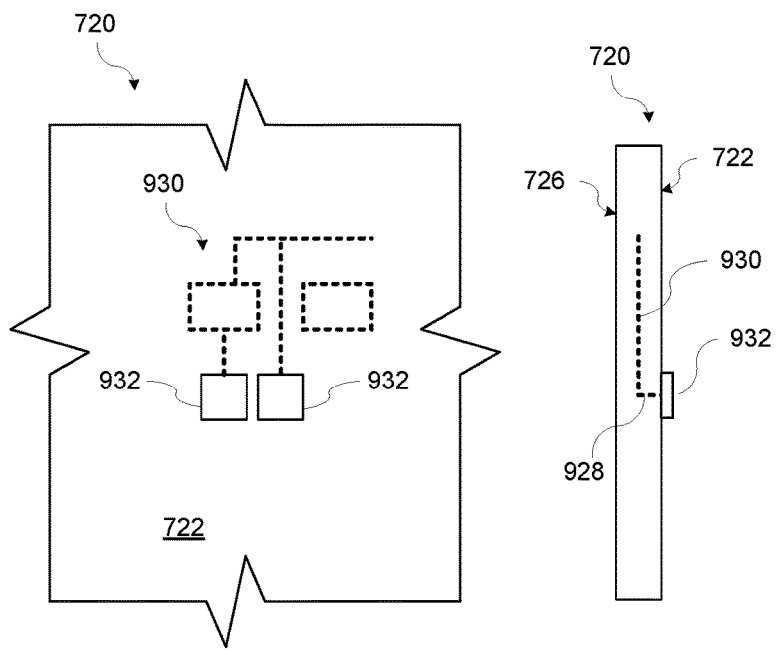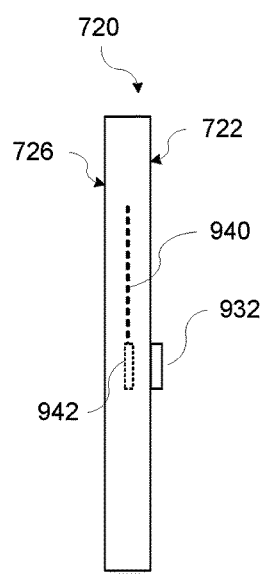
FIG. 9A  FIG. 9B

MULTIPLE ANTENNAS ON METER ENCLOSURE

BACKGROUND

Unless otherwise indicated herein, the materials described in this section are not prior art to the claims in this application and are not admitted to be prior art by inclusion in this section.

Electricity meters measure an amount of electricity consumed by a customer at a residential or commercial premises. As electricity meter communications technology progresses, the number of technologies used for radio frequency (RF) communications continues to grow. There are many options to choose from, and multiple communications technologies may be included in a single electricity meter. Each of these communications technologies may have unique antenna requirements including size and shape requirements as well as the need for multiple antennas for diversity. Multiple antennas take up space on printed circuit boards (PCBs) and the signals received by the antennas can be attenuated by the PCB itself. External antennas may be added and connected to the PCB circuitry using coaxial cables but the additions result in increased expense.

SUMMARY

Apparatuses for incorporating multiple antennas on an electricity meter are provided.

According to various aspects there is provided an electricity meter. In some aspects, the electricity meter may include: a housing; a plurality of antennas, each of the plurality of antennas may include a contacting portion formed on an interior surface of the housing; a printed circuit board (PCB) disposed within the housing, the PCB including a plurality of communications circuits, each of the plurality of communications circuits operable to communicate using different communications technologies; and a plurality of contacts disposed on the PCB. Each of the plurality of contacts may be configured to provide a solderless electrical connection between contacting portions of one or more of the plurality of antennas and one of the plurality of communications circuits when the PCB is installed in the housing.

One or more of the plurality of antennas may include a conductive antenna pattern formed on the interior surface of the housing, or a conductive antenna pattern embedded in the interior surface of the housing. The conductive antenna patterns may be electrically connected to the contacting portion formed on the interior surface of the housing.

One or more of the plurality of antennas may include a conductive antenna pattern formed on or embedded in an exterior surface of the housing, or a conductive antenna pattern embedded within the housing and covered by the interior surface of the housing. The conductive antenna patterns may be electrically connected to the contacting portion formed on the interior surface of the housing.

Each of the plurality of contacts disposed on the PCB may be electrically connected to one of the plurality of communications circuits operable to communicate on a particular communications technology and positioned on the PCB to connect the one of the plurality of communications circuits to one of the plurality of antennas corresponding to the particular communications technology. The plurality of contacts may be solderless spring contacts.

According to various aspects there is provided an assembly. In some aspects, the assembly may include: an inner housing having a module cavity; and a module assembly configured for insertion into the module cavity. The module assembly may include: a module housing; a first plurality of antennas, each of the first plurality of antennas including a contacting portion formed on an interior surface of the module housing; a printed circuit board (PCB) disposed within the module housing. The PCB may include a plurality of communications circuits, each of the plurality of communications circuits operable to communicate using different communications technologies; and a first plurality of contacts disposed on the PCB. Each of the first plurality of contacts may be configured to provide a solderless electrical connection between contacting portions of one or more of the first plurality of antennas and one of the plurality of communications circuits when the PCB is installed in the module housing. The assembly comprises an electricity meter.

One or more of the first plurality of antennas may include a conductive antenna pattern formed on the interior surface of the module housing. One or more of the first plurality of antennas may include a conductive antenna pattern embedded in the interior surface of the housing. The conductive antenna pattern may be electrically connected to the contacting portion formed on the interior surface of the inner housing.

One or more of the first plurality of antennas may include a conductive antenna pattern embedded within the module housing and covered by the interior surface of the module housing. The conductive antenna pattern electrically may be connected to the contacting portion formed on the interior surface of the module housing.

Each of the first plurality of contacts disposed on the PCB may be electrically connected to one of the plurality of communications circuits operable to communicate on a particular communications technology and positioned on the PCB to connect the one of the plurality of communications circuits to one of the first plurality of antennas corresponding to the particular communications technology.

The module housing may include a second plurality of contacts configured to provide a solderless electrical connection between one or more of the plurality of communications circuits and second contacting portions including a second plurality of antennas when the module housing is inserted into the module cavity of the inner housing. The second contacting portions may be formed on an interior surface of the inner housing. One or more of the second plurality of antennas may include a conductive antenna pattern formed on the interior surface of the inner housing. One or more of the second plurality of antennas may include a conductive antenna pattern embedded in the interior surface of the inner housing. The conductive antenna pattern may be electrically connected to the second contacting portions formed on the interior surface of the housing.

One or more of the second plurality of antennas may include a conductive antenna pattern embedded within the inner housing and covered by the interior surface of the inner housing, the conductive antenna pattern electrically connected to the second contacting portions formed on the interior surface of the inner housing. One or more of the second plurality of antennas may include a conductive antenna pattern formed on an exterior surface of the inner housing. The conductive antenna pattern may be electrically connected to the second contacting portions formed on the interior surface of the housing.

One or more of the second plurality of antennas may include a conductive antenna pattern embedded in an exterior surface of the inner housing. The conductive antenna pattern may be electrically connected to the second contacting portions formed on the interior surface of the housing.

Numerous benefits are achieved by way of the various embodiments over conventional techniques. For example, the various embodiments provide apparatuses and methods that can be used to overcome space limitations imposed by multiple antenna requirements for electricity meters. In some embodiments, one housing contains all antennas used for the employed RF communications technologies, providing flexibility of antenna design, freeing up space on the PCB, eliminating antenna redesign, and improving RF communications performance over PCB mounted antennas. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which:

FIGS. 3A-3J illustrate examples of antennas that may be used for wireless communications according to various aspects of the present disclosure.

FIGS. 5A and 5B are illustrations showing an example of an antenna formed on an exterior surface of the inner housing according to various aspects of the present disclosure;

FIGS. 6A and 6B are illustrations showing an example of an antenna molded into the inner housing according to various aspects of the present disclosure;

FIGS. 8A and 8B are illustrations showing an example of an antenna pattern formed on an exterior surface of the inner housing according to various aspects of the present disclosure; and FIGS. 9A and 9B are illustrations showing an example of an antenna pattern molded into the inner housing according to various aspects of the present disclosure.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Electricity meters may include measurement circuitry to measure and control electricity usage and communications circuitry (e.g., RF radios) to wirelessly communicate with other electricity meters and devices in a communications network. Many technologies are available for RF communications, for example, but not limited to, Cat-M, Cat-1, NB-IoT, ZigBee, Bluetooth, Wi-Fi, Wi-SUN, and cellular, as well as proprietary protocols, and the technologies may use many different frequencies. Each technology may have antenna size and shape requirements. In addition, one or more second antennas may be needed for diversity. Further, in some implementations an antenna may be needed for functions other than communications, such as a global positioning system (GPS) antenna. In accordance with various aspects of the present disclosure, multiple antenna patterns (i.e., shapes) may be manufactured into the electricity meter housing.

One or more printed circuit boards (PCBs), for example, a communications PCB, of the electricity meter may have contacts mounted at predefined positions, for example at the edge of the PCB or in other positions, to make contact and form an electrical connection with one or more selected antennas. Specific locations on the one or more PCBs may be designed to place contacts for specific antennas while the meter housing and the locations of the antennas on the meter housing remain the same. The antennas connected to the PCBs may be determined by the communications technologies employed by the particular electricity meter. Multiple antennas may be used for an electricity meter implementation using multiple contacts on the one or more PCBs to provide solderless electrical connections between one or more RF communications circuits and the appropriate antennas.

Figure 1A:
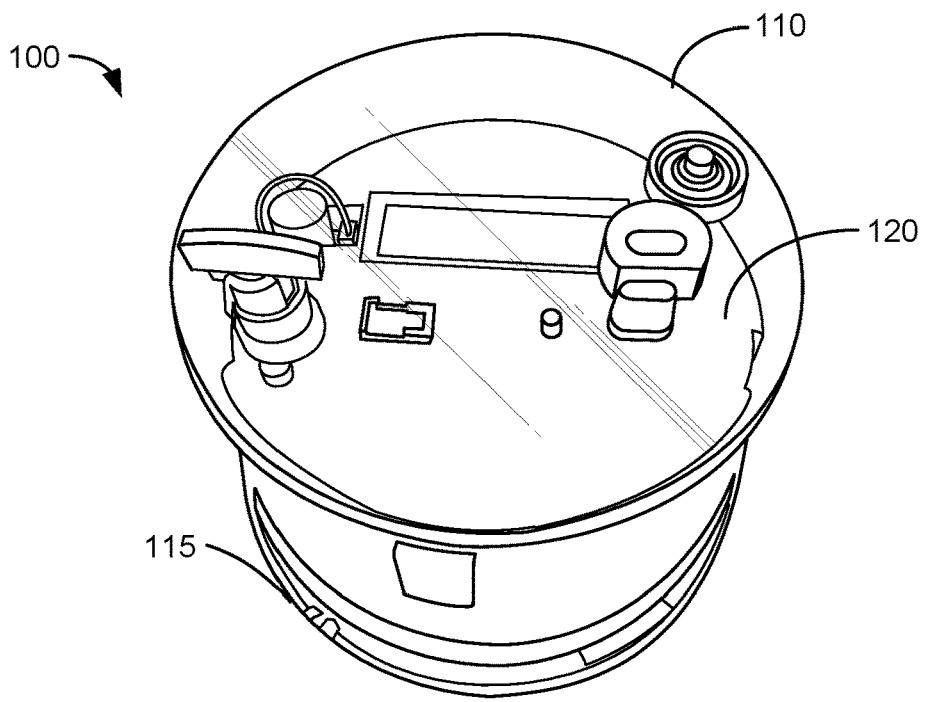
FIG. 1A illustrates an assembled view of an example electricity meter.
Figure 1B:
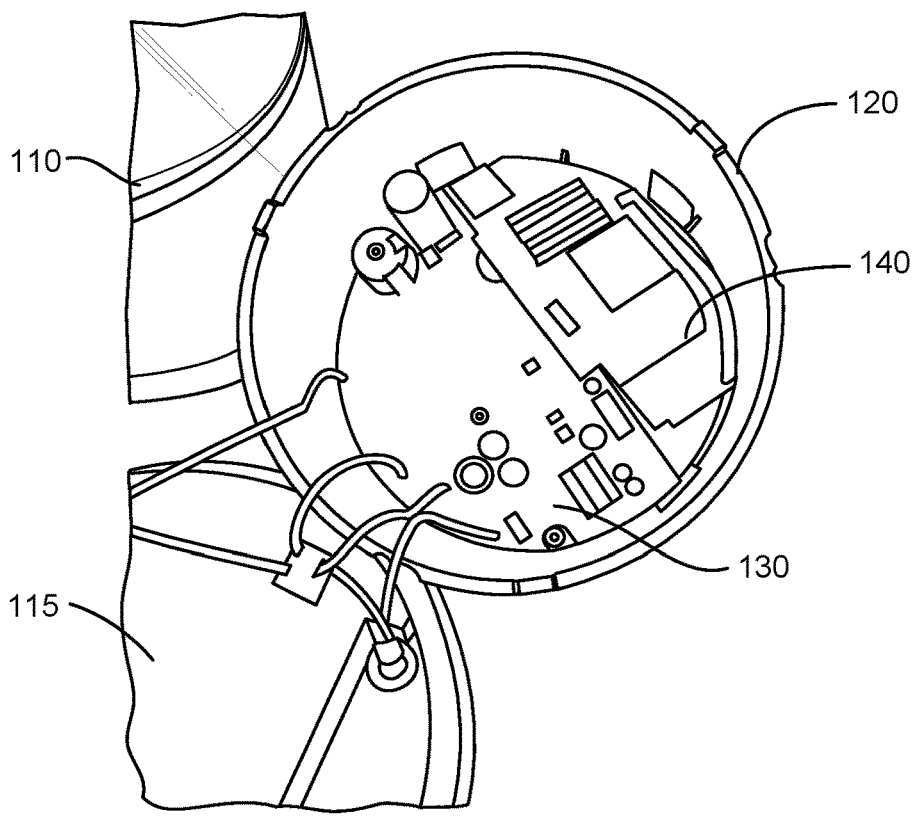
FIG. 1B illustrates a disassembled view of the example electricity meter.

FIG. 1A illustrates an assembled view of an example electricity meter 100. As illustrated in FIG. 1A, the electricity meter 100 may include a transparent outer cover 110 and an inner housing 120. The inner housing 120 may be formed from a suitable plastic, for example, but not limited to, polycarbonate, acrylonitrile butadiene styrene (ABS), etc. The inner housing 120 may form a cavity to enclose the electronic circuitry of the electricity meter 100. FIG. 1B illustrates a disassembled view of the example electricity meter 100 showing the meter base 115, the interior portion of the inner housing 120, and one or more PCBs. The meter base 115 may be configured to mount the electricity meter 100 to a meter socket (not shown).

The one or more PCBs may include a meter electronics PCB 130 and a communications PCB 140. The meter electronics PCB 130 may include circuitry to provide various functions, for example, but not limited to, a power supply module, a processing module, a metrology module, etc. The communications PCB 140 may include communications circuits to implement various communications technologies, for example, but not limited to, L+G Mesh (915 MHz), L+G Mesh (2.4 GHz), Cat-M, Cat-1, NB-IoT, ZigBee, Bluetooth, Wi-Fi, cellular, etc. Various communications technologies may use different antenna configurations. Baluns may be provided in the communications circuits to convert between balanced signals and an unbalanced signals and for impedance matching for different antennas.

In some embodiments, the communications PCB 140 may be a separate PCB from the meter electronics PCB 130 and may be electrically connected to the meter electronics PCB 130 by one or more mating connectors. In some embodiments, the meter electronics and the communications circuits may be incorporated onto one PCB. In other embodiments, some portions of the communications circuits may be disposed on the meter electronics PCB 130 while other portions of the communications circuits may be disposed on the communications PCB 140.

Figure 2A:
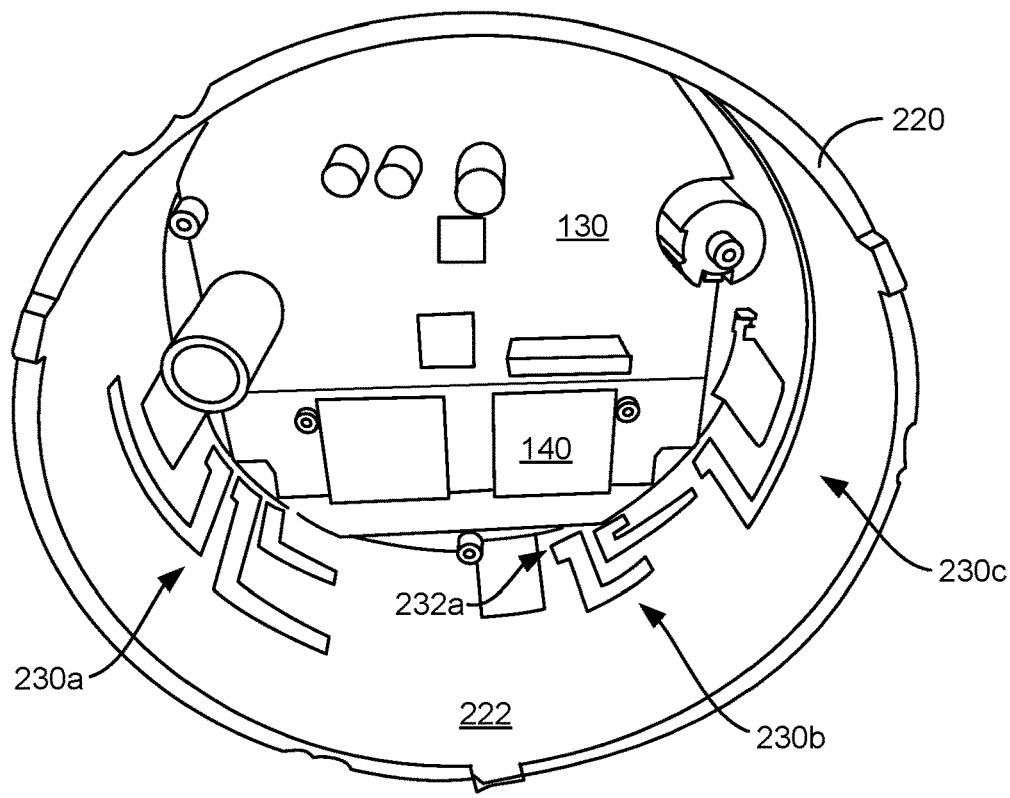
FIG. 2A is an illustration of an interior portion of an inner housing of an example electricity meter showing an interior side surface according to various aspects of the present disclosure.

FIG. 2A is an illustration of an interior portion of an inner housing 220 of an example electricity meter showing an interior side surface 222 according to various aspects of the present disclosure. Depending on the communications technologies incorporated into a particular electricity meter, various antenna configurations may be used. Incorporating a plurality of antenna patterns into the inner housing 220 of the electricity meter enables different communication technologies to be used by laying out PCBs to position solderless contacts at appropriate locations to form solderless electrical connections with antennas appropriate for the communications technologies. Further, incorporating antennas into the housing provides more space for antenna design options and eases design of the electricity meter PCBs since the antennas are no longer on the PCBs. In addition, the solderless electrical connections between the PCBs and antennas facilitates modular design of the electricity meter with a minimal number of housings.

Referring to FIG. 2A, one or more antenna patterns 230a, 230b, 230c may be formed on an interior side surface 222 of the inner housing 220. Antenna positions may be selected to mitigate noise and interference. The one or more antenna patterns may be formed, for example, by applying a conductive material (e.g., copper, aluminum, or other conductive material) to the interior side surface 222 of the inner housing 220 in the shapes of the desired antennas. Each of the antenna patterns may include a contact area 232a to provide an area for forming a solderless electrical connection with solderless contacts on the one or more PCBs.

One of ordinary skill in the art will appreciate that while only one contact area is identified in FIG. 2A, this is merely for convenience and each antenna pattern includes appropriate contact areas for forming solderless electrical connection with solderless contacts on the one or more PCBs of the electricity meter.

Figure 2B:
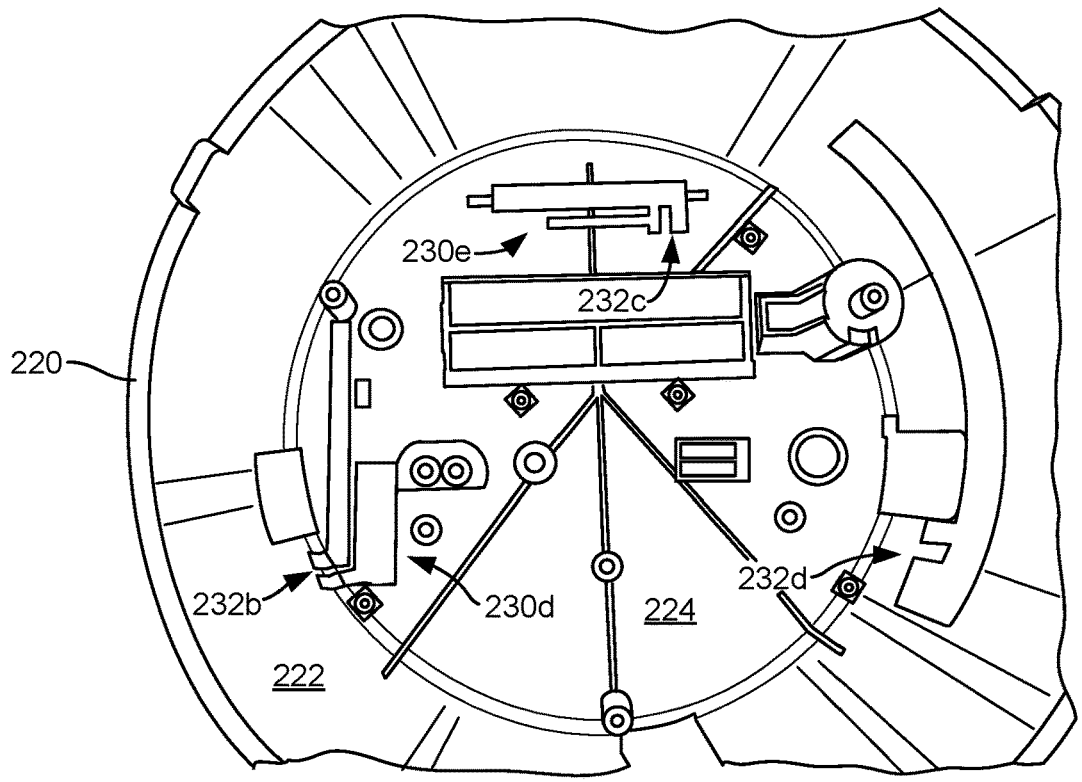
FIG. 2B is an illustration of an interior portion of an inner housing of an example electricity meter with the PCBs removed showing an interior front surface 224 according to various aspects of the present disclosure.

FIG. 2B is an illustration of an interior portion of an inner housing of an example electricity meter with the PCBs removed showing an interior front surface 224 according to various aspects of the present disclosure. In addition to forming antenna patterns on the interior side surface 222 of the inner housing 220, one or more antenna patterns may be formed on the interior front surface 224 of the inner housing 220. Referring to FIG. 2B, antenna patterns 230d and 230e are formed on the interior front surface 224 of the inner housing 220. In some cases, the antenna patterns may extend across the interior side surface 222 and the interior front surface 224. FIG. 2B also illustrates examples of antenna pattern contact areas 232b, 232c, 232d for forming solderless electrical connections with solderless contacts on the one or more PCBs.

The antenna patterns may be formed on the interior surfaces of the inner housing by any suitable process. For example, antenna patterns may be formed by electroless plating, electroplating, vacuum metallization, laser direct structuring (LDS), or by other methods known to those of skill in the art.

While FIGS. 2A and 2B each depict three example antenna patterns, more or fewer antenna patterns may be formed on the interior side surface 222 and/or the interior front surface 224 without departing from the scope of the present disclosure. Further, one of ordinary skill in the art will appreciate that the antenna patterns illustrated in FIGS. 2A and 2B are merely for purposes of illustration and are not meant to depict functional antennas.

Figure 3A:
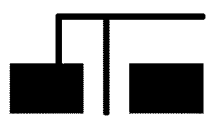
Figure 3B:
Figure 3C:
Figure 3D:
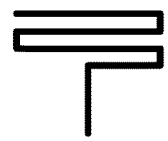
Figure 3E:
Figure 3F:
Figure 3G:
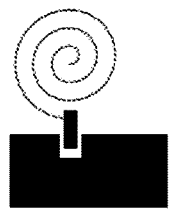
Figure 3H:
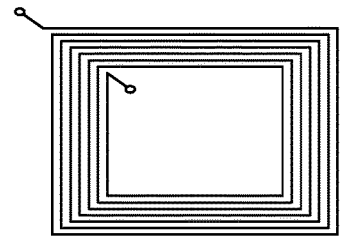
Figure 3J:
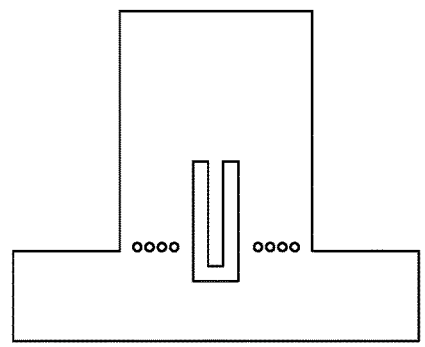

Various embodiments may include antennas of different shapes and types depending on the communications technologies employed. FIGS. 3A-3J illustrate examples of antennas that may be used for wireless communications according to various aspects of the present disclosure. Referring to FIGS. 3A-3J, the antennas may include, for example, but not limited to, inverted F antennas (FIG. 3A), dipole antennas (FIG. 3B), folded dipole antennas (FIG. 3C), monopole antennas (FIG. 3D), notch or slot antennas (FIG. 3E), stub antennas (FIG. 3F), spiral antennas (FIG. 3G), loop or semi-loop antennas (FIG. 3H), and/or patch antennas (FIG. 3J). In addition, printed antennas, dual band antennas, diversity antennas disposed in different orientations, other near field communications (NFC) antennas, etc., as well as shielding and ground planes, for various communications technologies and antenna configurations may be used. One of ordinary skill in the art will appreciate that other antennas may be used without departing from the scope of the present disclosure.

Figure 4:
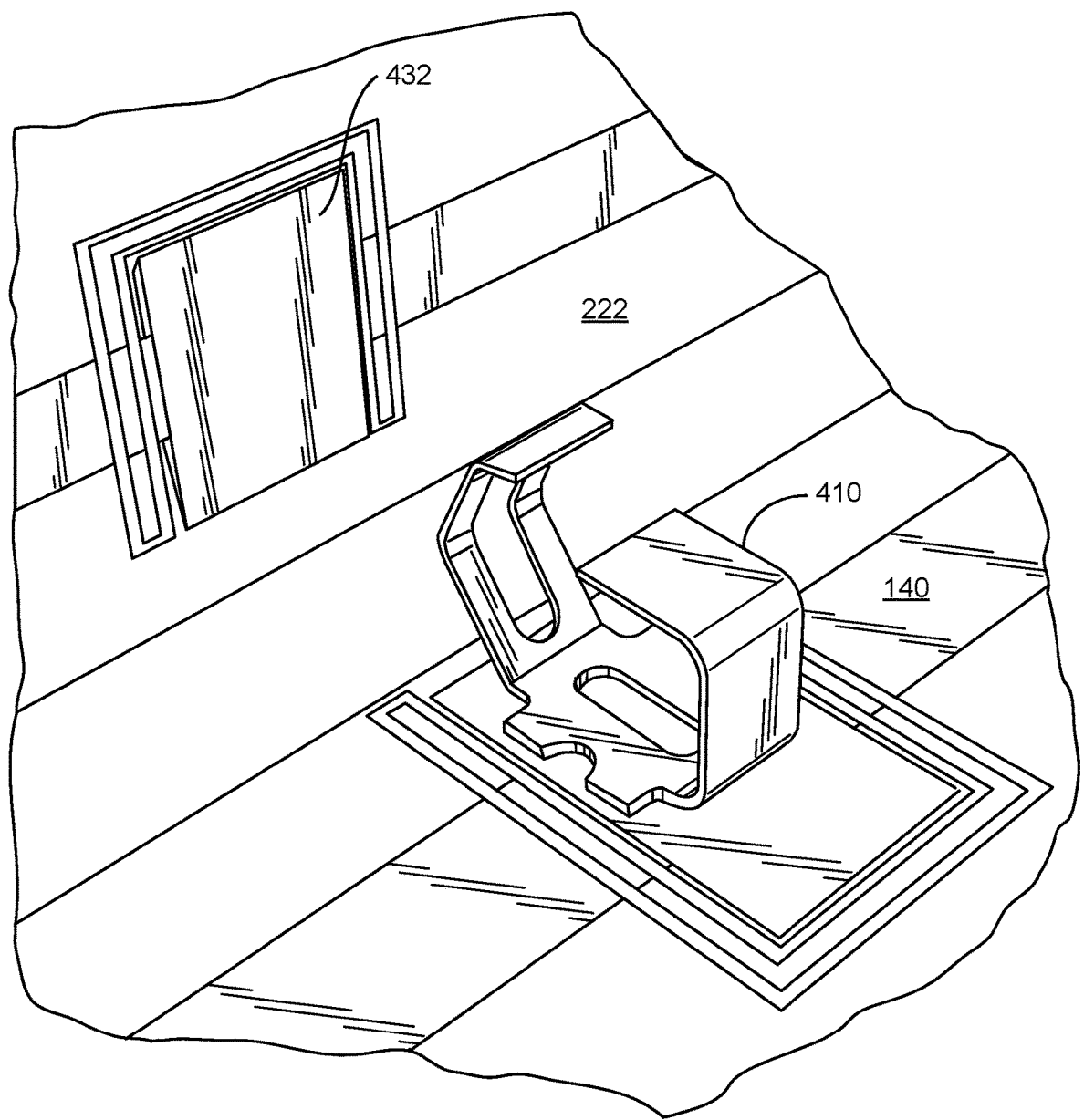
FIG. 4 is an illustration of an example contact for providing a solderless connection according to various aspects of the present disclosure.

In accordance with various aspects of the present disclosure, solderless electrical connections between the one or more antenna patterns and the one or more PCBs may be formed using solderless contacts, for example, but not limited to, spring contacts or spring finger contacts. FIG. 4 is an illustration of an example contact for providing a solderless connection according to various aspects of the present disclosure. Referring to FIG. 4, the contact 410 may provide solderless interconnections between an antenna pattern contact area 432 formed on the interior side surface 222 and/or interior front surface 224 of the inner housing 220 and one of the PCBs, for example, the communications PCB 140.

In some implementations, solderless interconnections between an antenna pattern contact area 432 and the meter electronics PCB 130 may be formed, for example with the contact 410, and conductive traces in the meter electronics PCB 130 may connect the contact 410 to the communications PCB 140, for example through a mating connector. In some implementations, one PCB may contain both the meter electronics and the communications circuits. In such cases, one or more contacts 410 may be disposed at appropriate locations on the one PCB to contact the contact area(s) of the appropriate antenna pattern(s). The PCBs may be designed such that the contacts 410 are positioned at appropriate locations to form solderless electrical connections with the antenna pattern contact areas 432 formed on the interior side surface 222 and/or the interior front surface 224 of the inner housing 220.

In some embodiments, a single point contact may be used to electrically connect an antenna pattern to the PCB, i.e., the meter electronics PCB 130 or the communications PCB 140. In other embodiments, a balanced line (e.g., a two-point contact) may be used to electrically connect an antenna pattern to the PCB. In still other embodiments, coaxial connections including a coaxial cable between the PCB and the an antenna pattern disposed on or in the electricity meter 100 inner housing 120 may be used to electrically connect an antenna pattern to the PCB. One of ordinary skill in the art will appreciate that these configuration as well as other variations of the disclosed configurations may be used without departing from the scope of the present disclosure. Further, one of ordinary skill in the art will appreciate that the contact illustrated in FIG. 4 is merely exemplary and other contact forms/types may be used without departing from the scope of the present disclosure.

In some implementations, in addition to forming antenna patterns on the interior surface of the inner housing of the electricity meter, one or more antenna patterns may be formed on the exterior surface of the inner housing. FIG. 5A is an illustration showing an example of an antenna pattern formed on an exterior surface of the inner housing according to various aspects of the present disclosure. Referring to FIG. 5A, an antenna pattern 530 may be formed on an exterior surface 526 of an inner housing 520. One or more antenna patterns 530 may be formed on the exterior surface 526 of the inner housing 520 using the same processes used to form antenna patterns on the interior surfaces of the inner housing as described with respect to FIGS. 2A and 2B. Antenna pattern contact areas 532 may be exposed in appropriate locations on the interior surface 522 of the inner housing 520 to provide solderless connections to the PCBs. Vias 528 may be formed to electrically connect the antenna patterns 530 formed on the exterior surface 526 to the antenna pattern contact areas 532 formed on the interior surface 522 of the inner housing 520.

In some implementations, antenna patterns may be formed on the exterior surface of the inner housing may be capacitively coupled to antenna pattern contact areas locations on the interior surface of the inner housing as illustrated in FIG. 5B. Referring to FIG. 5B, the antenna pattern 540 may be formed on an exterior surface 526 of an inner housing 520 may include capacitive coupling portions 542 to capacitively couple the antenna pattern 540 to the antenna pattern contact areas 532 formed in appropriate locations on the interior surface 522 of the inner housing 520. The antenna pattern contact areas 532 may be formed in appropriate locations on the interior surface 522 of the inner housing 520 to provide solderless connections to the PCBs. The capacitive coupling portions 542 and the antenna pattern contact areas 532 may be sized appropriately to provide capacitive coupling between the antenna pattern 540 and the circuitry on the PCBs.

In some implementations, antenna patterns may be molded into the inner housing of the electricity meter such that the antenna patterns are embedded in the inner housing, and the interior surface and the exterior surface of the inner housing surround the antenna patterns. FIG. 6A is an illustration showing an example of an antenna pattern molded into the inner housing according to various aspects of the present disclosure. Referring to FIG. 6A, an antenna pattern 630 may be embedded within a portion of the inner housing 620. For example, the antenna pattern 630 may be molded into the inner housing 620 such that the antenna pattern 630 is formed between the interior surface 622 and the exterior surface 626 of the inner housing 620. The antenna patterns may be molded into the inner housing using, for example, insert molding processes, overmolding processes, or other suitable processes known to those of skill in the art. Antenna pattern contact areas 632 may be exposed in appropriate locations on the interior surface 622 of the inner housing 620 to provide solderless connections to the PCBs. Vias 628 may be formed to electrically connect the antenna pattern 630 embedded in the inner housing 620 to the antenna pattern contact areas 632 formed on the interior surface 622 of the inner housing 620.

In some implementations, antenna patterns molded into the inner housing may be capacitively coupled to antenna pattern contact areas locations on the interior surface of the inner housing as illustrated in FIG. 6B. Referring to FIG. 6B, the antenna pattern 640 may be formed on an exterior surface 626 of an inner housing 620 may include capacitive coupling portions 642 to capacitively couple the antenna pattern 640 to the antenna pattern contact areas 632 formed in appropriate locations on the interior surface 622 of the inner housing 620. The antenna pattern contact areas 632 may be formed in appropriate locations on the interior surface 622 of the inner housing 620 to provide solderless connections to the PCBs. The capacitive coupling portions 642 and the antenna pattern contact areas 632 may be sized appropriately to provide capacitive coupling between the antenna pattern 640 and the circuitry on the PCBs.

One of ordinary skill in the art will appreciate that combinations of antenna patterns formed on the interior and exterior surfaces of the inner housing and antenna patterns embedded within the inner housing may be used without departing from the scope of the present disclosure. Further, one of ordinary skill in the art will appreciate that the antenna patterns illustrated in FIGS. 5A, 5B, 6A, and 6B are merely for purposes of illustration and are not meant to depict functional antennas.

Figure 7A:
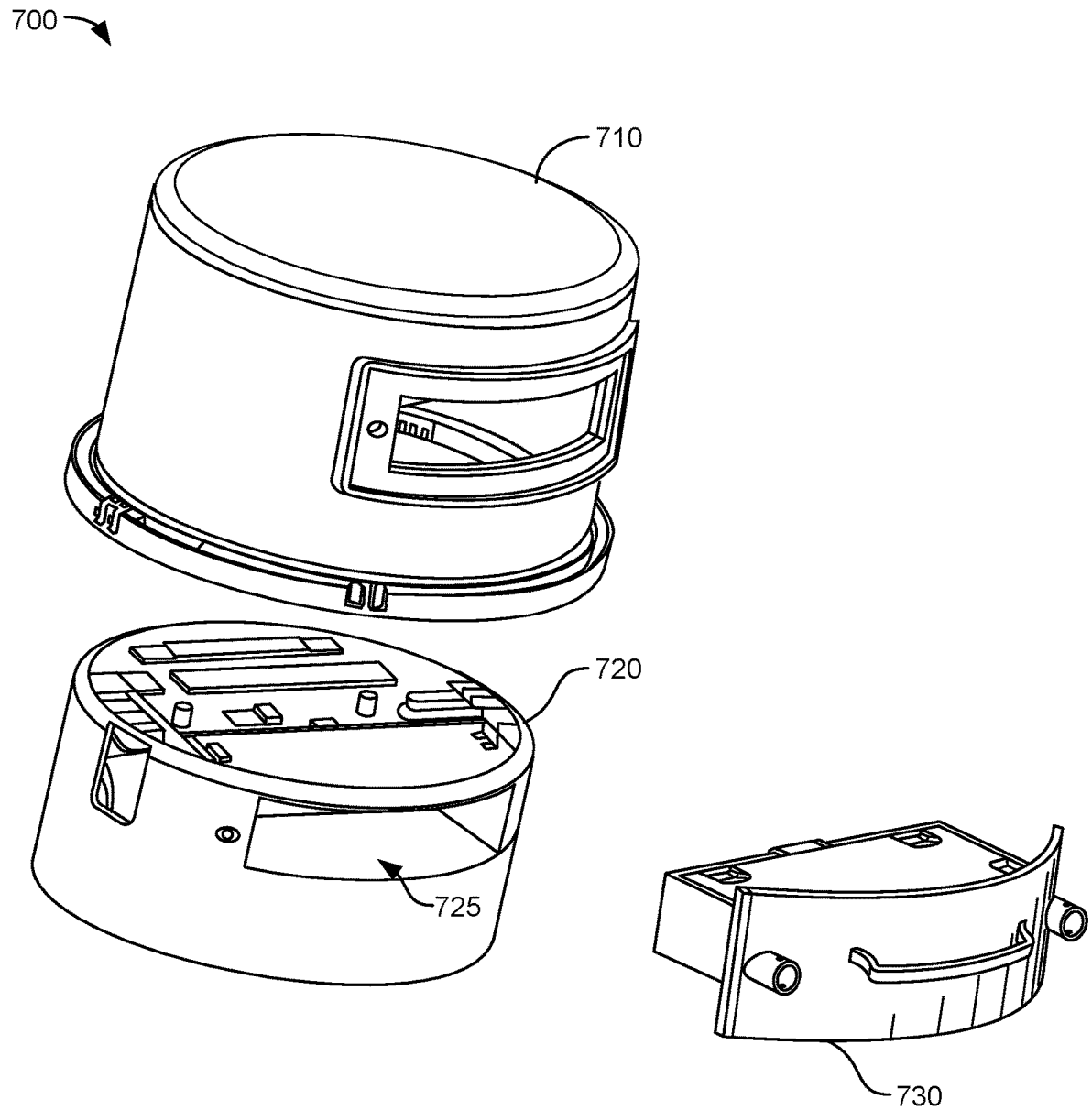
FIG. 7A illustrates an example electricity meter having a removable module according to various aspects of the present disclosure.

In some embodiments, the communications PCB may be disposed within a removable module. FIG. 7A illustrates an example electricity meter having a removable module according to various aspects of the present disclosure. Referring to FIG. 7A, the example electricity meter 700 may include a transparent outer cover 710, an inner housing 720, and a removable module assembly 730. The inner housing 720 may form a cavity to enclose one or more meter electronics PCBs (not shown) containing the electronic circuitry of the electricity meter 700. The one or more meter electronics PCB may include circuitry to provide various functions, for example, but not limited to, a power supply module, a processing module, a metrology module, etc. The inner housing 720 may further include a module cavity 725 configured to accommodate the removable module assembly 730. The inner housing 720 and the removable module assembly 730 may be formed from a suitable plastic.

One or more antenna patterns (not shown) may be formed on an interior side surface and/or interior front surface of the inner housing 720 in the same manner as antenna patterns may be formed on the interior side surface 222 and/or interior front surface 224 of the inner housing 220 as described and illustrated with respect to FIGS. 2A and 2B. Antenna positions may be selected to mitigate noise and interference. The one or more antenna patterns may be formed for example, by applying a conductive material, for example, copper, aluminum, or other conductive material, to the interior side surface of the inner housing 720 in the shapes of the desired antennas. In some cases, the antenna patterns may extend across the interior side surface and the interior front surface of the inner housing 720.

Each of the antenna patterns may include a contact area to provide an area for forming solderless electrical connections with the one or more PCBs. The antenna patterns may be formed on the interior side surface and/or the interior front surface of the inner housing 720 by any suitable process. For example, antenna patterns may be formed by electroless plating, electroplating, vacuum metallization, laser direct structuring (LDS), or by other methods known to those in the art.

In some implementations, in addition to forming antenna patterns on the interior surfaces of the inner housing 720 of the electricity meter having a removable module assembly 730, one or more antenna patterns may be formed on the exterior surfaces of the inner housing 720. FIG. 8A is an illustration showing an example of an antenna pattern formed on an exterior surface 726 of the inner housing 720 according to various aspects of the present disclosure. Referring to FIG. 8A, one or more antenna patterns 830 may be formed on the exterior surface 726 of the inner housing 720 using the same processes used to form antenna patterns on the interior surfaces of the inner housing as described with respect to FIGS. 2A and 2B. Antenna pattern contact areas 832 may be exposed in appropriate locations on the interior surface 722 of the inner housing 720 to provide solderless connections to the PCBs. Vias 828 may be formed to electrically connect the antenna patterns 830 formed on the exterior surface 726 to the antenna pattern contact areas 832 formed on the interior surface 722 of the inner housing 720.

In some implementations, antenna patterns may be formed on the exterior surface of the inner housing may be capacitively coupled to antenna pattern contact areas locations on the interior surface of the inner housing as illustrated in FIG. 8B. Referring to FIG. 8B, the antenna pattern 840 may be formed on an exterior surface 726 of an inner housing 720 may include capacitive coupling portions 842 to capacitively couple the antenna pattern 840 to the antenna pattern contact areas 832 formed in appropriate locations on the interior surface 722 of the inner housing 720. The antenna pattern contact areas 832 may be formed in appropriate locations on the interior surface 722 of the inner housing 720 to provide solderless connections to the PCBs. The capacitive coupling portions 842 and the antenna pattern contact areas 832 may be sized appropriately to provide capacitive coupling between the antenna pattern 840 and the circuitry on the PCBs.

In some implementations, antenna patterns may be molded into the inner housing 720 of the electricity meter such that the antenna patterns are embedded in the inner housing 720 and the interior surface and the exterior surface of the inner housing 720 surround the antenna patterns. FIG. 9A is an illustration showing an example of an antenna pattern 930 molded into the inner housing 720 according to various aspects of the present disclosure. Referring to FIG. 9A, an antenna pattern 930 may be embedded within a portion of the inner housing 720. For example, the antenna pattern 930 may be molded into the inner housing 720 such that the antenna pattern 930 is formed between the interior surface 722 and the exterior surface 726 of the inner housing 720. The antenna patterns may be molded into the inner housing using, for example, insert molding processes, overmolding processes, or other suitable processes known to those of skill in the art. Antenna pattern contact areas 932 may be exposed in appropriate locations on the interior surface 722 of the inner housing 720 to provide solderless connections to the PCBs. Vias 928 may be formed to electrically connect the antenna pattern 930 embedded in the inner housing 720 to the antenna pattern contact areas 932 formed on the interior surface 722 of the inner housing 720.

In some implementations, antenna patterns molded into the inner housing may be capacitively coupled to antenna pattern contact areas locations on the interior surface of the inner housing as illustrated in FIG. 9B. Referring to FIG. 9B, the antenna pattern 940 molded into the inner housing 720 may include capacitive coupling portions 942 to capacitively couple the antenna pattern 940 to the antenna pattern contact areas 932 formed in appropriate locations on the interior surface 722 of the inner housing 720. The antenna pattern contact areas 932 may be formed in appropriate locations on the interior surface 722 of the inner housing 720 to provide solderless connections to the PCBs. The capacitive coupling portions 942 and the antenna pattern contact areas 932 may be sized appropriately to provide capacitive coupling between the antenna pattern 940 and the circuitry on the PCBs.

Figure 7B:
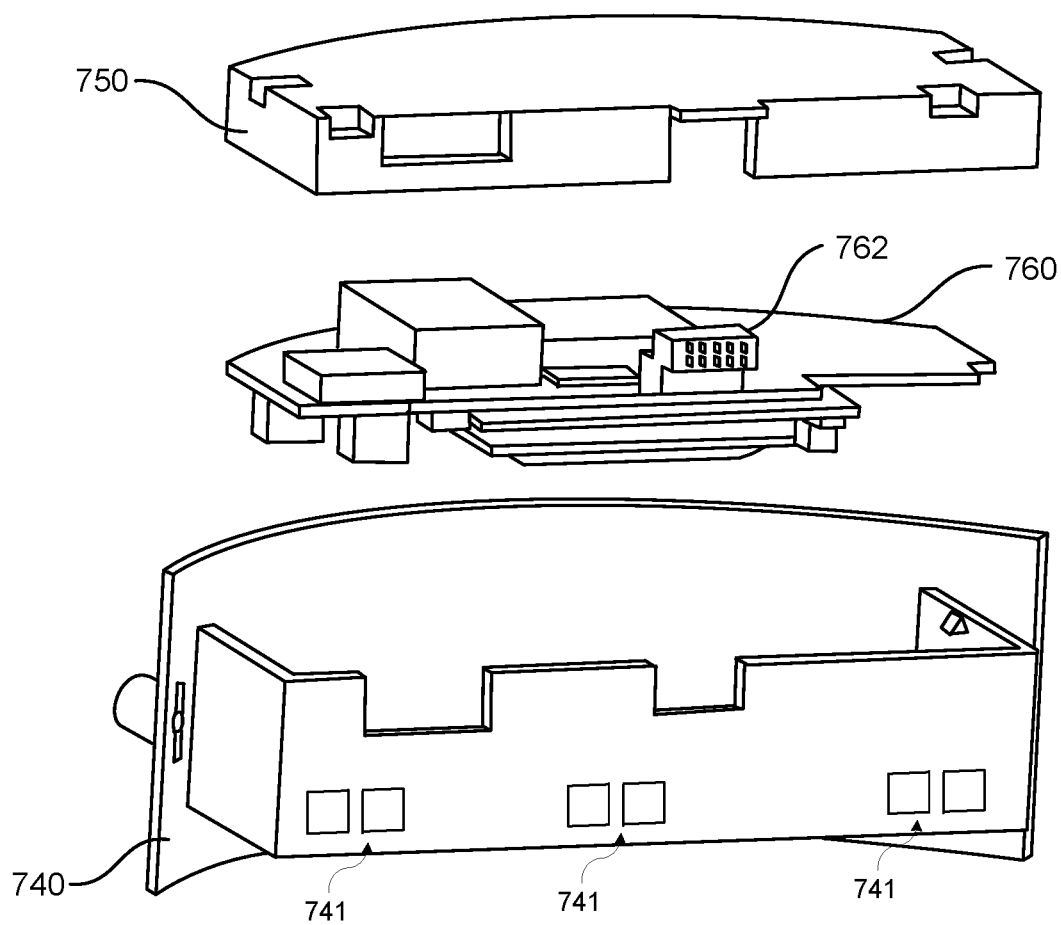
FIGS. 7B and 7C illustrate an example of a removable module assembly according to various aspects of the present disclosure.

FIG. 7B illustrates an example of a removable module assembly according to various aspects of the present disclosure. Referring to FIG. 7B, the removable module assembly 730 may include a lower housing 740, an upper housing 750 and a PCB 760. The PCB 760 may be, for example, a communications PCB. The communications PCB 760 may include communications circuits to implement various communications technologies, for example, but not limited to, L+G Mesh (915 MHz), L+G Mesh (2.4 GHz), Cat-M, Cat-1, NB-IoT, ZigBee, Bluetooth, Wi-Fi, cellular, etc. Various communications technologies may use different antenna configurations. Baluns may be provided in the communications circuits to convert between balanced signals and an unbalanced signals and for impedance matching for different antennas. The communications PCB 760 may be electrically connected to the meter electronics PCB (not shown) by one or more mating connectors 762. In some embodiments, some portions of the communications circuits may be disposed on the meter electronics PCB while other portions of the communications circuits may be disposed on the communications PCB 760.

In some implementations, contact areas 741, or vias, may be formed through portions of the lower housing 740 corresponding to solderless electrical connectors (e.g., solderless electrical connector 410 in FIG. 4) disposed on the communications PCB 760 enclosed in the removable module assembly 730 and solderless electrical connectors disposed on a meter electronics PCB or other PCB within the inner housing 720. The contact areas 741 may form a connection between the communications PCB 760 and the PCB within the inner housing 720. The PCB within the inner housing 720 may have additional solderless electrical connectors disposed so as to contact one or more antenna contact areas on an interior surface of the inner housing 720 thereby completing an electrical connection between the communications PCB 760 and one or more antennas. One of ordinary skill in the art will appreciate that while contact areas 741 are illustrated in FIG. 7B on only one surface of the lower housing 740, the contact area 741 may be disposed on other portions of the lower housing 740 or the upper housing 750 without departing from the scope of the present disclosure. One of ordinary skill in the art will recognize many variations.

Electrical wiring traces within the meter electronics PCB may form electrical connections with additional solderless electrical connectors disposed on the meter electronics PCB at appropriate locations to form solderless electrical connections with antenna pattern contact areas of one or more antenna patterns (not shown) formed in or on the inner housing 720. In some implementations, electrical connections between the communications PCB 760 and the solderless electrical connectors forming electrical contact with the antenna pattern contact areas may be formed through a connector (e.g., the mating connector 762) configured to connect the communications PCB 760 to the meter electronics PCB.

Figure 7C:
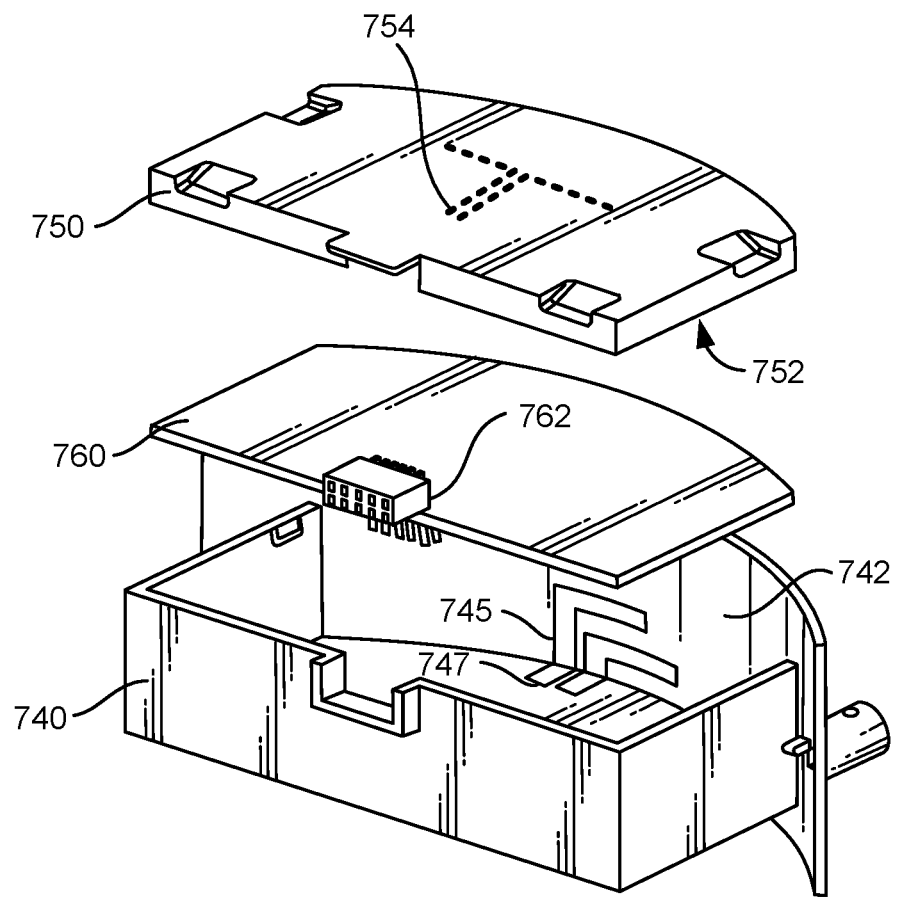

Additionally or alternatively, one or more antenna patterns may be formed on interior surfaces of the removable module assembly 730. FIG. 7C illustrates some interior surfaces of an example of a removable module assembly 730 according to various aspects of the present disclosure. Referring to FIG. 7C, one or more antenna patterns 745 may be formed on any of the interior surfaces of the removable module assembly 730 including the interior side, back, front, and bottom surfaces. The antenna patterns may be formed on the interior surfaces of the removable module assembly 730 by any suitable process. For example, antenna patterns may be formed by electroless plating, electroplating, vacuum metallization, laser direct structuring (LDS), or by other methods known to those of skill in the art.

FIG. 7C illustrates a representative example of an antenna pattern 745 formed on an interior front surface 742 of the removable module assembly 730 with antenna pattern contact areas 747 formed on the bottom surface. The antenna pattern contact area 747 may correspond with solderless electrical contacts disposed on the communications PCB 760 to form solderless electrical connections between the communications PCB 760 and the antenna pattern contact area 747. One of ordinary skill in the art will appreciate that while the antenna pattern 745 is illustrated in FIG. 7C on only one surface of the lower housing 740, one or more antenna patterns may be disposed on other portions of the lower housing 740 without departing from the scope of the present disclosure. One of ordinary skill in the art will recognize many variations.

In some implementations, one or more antenna patterns 754 may be formed on the interior surface of the upper housing 750 of the removable module assembly 730. The communications PCB 760 may include appropriately placed contacts (not shown) to provide solderless interconnections between antenna pattern contact areas and the communications PCB 760. One of ordinary skill in the art will appreciate that the antenna patterns illustrated in FIG. 7C are merely for purposes of illustration and are not meant to depict functional antennas.

In some implementations, antenna patterns may additionally or alternatively be formed on external surfaces of the removable module assembly 730 in a manner similar to that illustrated in FIGS. 8A and 8B. In some implementations, antenna patterns may additionally or alternatively be molded into the removable module assembly 730 such that the antenna patterns are embedded in the removable module assembly 730 and the interior surface and the exterior surface of the removable module assembly 730 surround the antenna patterns in a manner similar to that illustrated in FIGS. 9A and 9B. The antenna patterns may be molded into the removable module assembly using, for example, insert molding processes, overmolding processes, or other suitable processes known to those of skill in the art. The antenna patterns formed on the exterior surface of the removable module assembly 730 and or molded into the removable module assembly 730 may be electrically connected to antenna contact areas by vias or capacitively coupled to antenna contact areas as described with respect to FIGS. 8A, 8B, 9A, and 9B.

While the above examples have been described in relation to electricity meters having a substantially cylindrical configuration, embodiments in accordance with the present disclosure are not limited to these implementations. For example, in some embodiments the electricity meters may have other configurations such as rectangular, square, etc. In some cases, electricity meters may have a housing configuration different than the inner housing/outer housing configuration described above, for example, one housing or additional housings. One of ordinary skill in the art will appreciate that these configuration as well as other variations of the disclosed configurations may be used without departing from the scope of the present disclosure.

Further, while the above example embodiments have been described in relation to electricity meters, other implementations in accordance with the present disclosure are possible. Any device that has a housing and uses wireless communications technologies requiring one or more antennas, for example, but not limited to, collectors, routers, repeaters, street light controllers, radios, navigation devices, gas meters, water meters, other types of meters, sensors, etc., may benefit from incorporating multiple antennas in their housings or enclosures as described in the present disclosure. It is contemplated that these implementations will fall within the scope of the present disclosure.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. An electricity meter, comprising:
a housing;
an outer cover removably coupled to the housing, the outer cover enclosing a front surface of the housing;
a plurality of antennas, each of the plurality of antennas comprising a contacting portion, the contacting portion formed on an interior surface of the housing;
a printed circuit board (PCB) disposed within the housing, the PCB comprising a plurality of communications circuits, each of the plurality of communications circuits operable to communicate using different communications technologies; and
a plurality of contacts disposed on the PCB, each of the plurality of contacts configured to provide a solderless electrical connection between contacting portions of one or more of the plurality of antennas and one of the plurality of communications circuits when the PCB is installed in the housing.

2. The electricity meter of claim 1, wherein one or more of the plurality of antennas comprises a conductive antenna pattern formed on the interior surface of the housing.

3. The electricity meter of claim 1, wherein one or more of the plurality of antennas comprises a conductive antenna pattern embedded in the interior surface of the housing, the conductive antenna pattern electrically connected to the contacting portion formed on the interior surface of the housing.

4. The electricity meter of claim 1, wherein one or more of the plurality of antennas comprises a conductive antenna pattern embedded within the housing and covered by the interior surface of the housing, the conductive antenna pattern electrically connected to the contacting portion formed on the interior surface of the housing.

5. The electricity meter of claim 1, wherein one or more of the plurality of antennas comprises a conductive antenna pattern formed on an exterior surface of the housing, the conductive antenna pattern electrically connected to the contacting portion formed on the interior surface of the housing.

6. The electricity meter of claim 1, wherein one or more of the plurality of antennas comprises a conductive antenna pattern embedded in an exterior surface of the housing, the conductive antenna pattern electrically connected to the contacting portion formed on the interior surface of the housing.

7. The electricity meter of claim 1, wherein each of the plurality of contacts disposed on the PCB is electrically connected to one of the plurality of communications circuits operable to communicate on a particular communications technology and positioned on the PCB to connect the one of the plurality of communications circuits to one of the plurality of antennas corresponding to the particular communications technology.

8. The electricity meter of claim 1, wherein the plurality of contacts are solderless spring contacts.

9. An assembly comprising:
a first housing comprising a module cavity;
an outer cover removably coupled to the first housing, the outer cover enclosing a front surface of the first housing and including an opening corresponding to a position of the module cavity; and
a module assembly configured for insertion into the module cavity, the module assembly comprising:
a module housing;
a first plurality of antennas, each of the first plurality of antennas comprising a contacting portion, the contacting portion formed on an interior surface of the module housing;
a printed circuit board (PCB) disposed within the module housing, the PCB comprising a plurality of communications circuits, each of the plurality of communications circuits operable to communicate using different communications technologies; and
a first plurality of contacts disposed on the PCB, each of the first plurality of contacts configured to provide a solderless electrical connection between contacting portions of one or more of the first plurality of antennas and one of the plurality of communications circuits when the PCB is installed in the module housing.

10. The assembly of claim 9, wherein one or more of the first plurality of antennas comprises a conductive antenna pattern formed on the interior surface of the module housing.

11. The assembly of claim 9, wherein one or more of the first plurality of antennas comprises a conductive antenna pattern embedded in the interior surface of the module housing, the conductive antenna pattern electrically connected to the contacting portion formed on the interior surface of the module housing.

12. The assembly of claim 9, wherein one or more of the first plurality of antennas comprises a conductive antenna pattern embedded within the module housing and covered by the interior surface of the module housing, the conductive antenna pattern electrically connected to the contacting portion formed on the interior surface of the module housing.

13. The assembly of claim 9, wherein each of the first plurality of contacts disposed on the PCB is electrically connected to one of the plurality of communications circuits operable to communicate on a particular communications technology and positioned on the PCB to connect the one of the plurality of communications circuits to one of the first plurality of antennas corresponding to the particular communications technology.

14. The assembly of claim 9, wherein the module housing comprises a second plurality of contacts configured to provide a solderless electrical connection between one or more of the plurality of communications circuits comprising the PCB and second contacting portions comprising a second plurality of antennas when the module housing is inserted into the module cavity of the first housing, the second contacting portions formed on an interior surface of the first housing.

15. The assembly of claim 14, wherein one or more of the second plurality of antennas comprises a conductive antenna pattern formed on the interior surface of the first housing.

16. The assembly of claim 14, wherein one or more of the second plurality of antennas comprises a conductive antenna pattern embedded in the interior surface of the first housing, the conductive antenna pattern electrically connected to the second contacting portions formed on the interior surface of the first housing.

17. The assembly of claim 14, wherein one or more of the second plurality of antennas comprises a conductive antenna pattern embedded within the first housing and covered by the interior surface of the first housing, the conductive antenna pattern electrically connected to the second contacting portions formed on the interior surface of the first housing.

18. The assembly of claim 14, wherein one or more of the second plurality of antennas comprises a conductive antenna pattern formed on an exterior surface of the first housing, the conductive antenna pattern electrically connected to the second contacting portions formed on the interior surface of the first housing.

19. The assembly of claim 14, wherein one or more of the second plurality of antennas comprises a conductive antenna pattern embedded in an exterior surface of the first housing, the conductive antenna pattern electrically connected to the second contacting portions formed on the interior surface of the first housing.

20. The assembly of claim 9, wherein the assembly comprises an electricity meter.

\* \* \* \* \*